United States Patent
Okamoto

(10) Patent No.: US 8,841,655 B2
(45) Date of Patent: Sep. 23, 2014

(54) ORGANIC ELECTROLUMINESCENCE ELEMENT, MANUFACTURING METHOD THEREOF, AND ORGANIC ELECTROLUMINESCENCE DISPLAY DEVICE

(75) Inventor: Ken Okamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 294 days.

(21) Appl. No.: 13/512,005

(22) PCT Filed: Oct. 12, 2010

(86) PCT No.: PCT/JP2010/067879
§ 371 (c)(1),
(2), (4) Date: Aug. 9, 2012

(87) PCT Pub. No.: WO2011/065136
PCT Pub. Date: Jun. 3, 2011

(65) Prior Publication Data
US 2012/0305898 A1    Dec. 6, 2012

(30) Foreign Application Priority Data

Nov. 27, 2009 (JP) ................................ 2009-270820

(51) Int. Cl.
*H01L 35/24* (2006.01)
(52) U.S. Cl.
USPC ..................................... 257/40; 257/E51.001
(58) Field of Classification Search
USPC ........................................... 257/40, E51.001
See application file for complete search history.

(56) References Cited

U.S. PATENT DOCUMENTS

2009/0261360 A1    10/2009   Yasukawa et al.

FOREIGN PATENT DOCUMENTS

| JP | 2005-108572 A | 4/2005 |
|----|---------------|--------|
| JP | 2005-203293 A | 7/2005 |
| JP | 2006-100806 A | 4/2006 |
| JP | 2007-251097 A | 9/2007 |
| JP | 2008-277494 A | 11/2008 |
| JP | 2009-147276 A | 7/2009 |
| JP | 2009-181755 A | 8/2009 |
| WO | 2006/070619 A1 | 7/2006 |
| WO | 2011/065137 A1 | 6/2011 |
| WO | 2011/065138 A1 | 6/2011 |

OTHER PUBLICATIONS

International Search Report received for PCT Patent Application No. PCT/JP2010/067879, mailed on Jan. 25, 2011, 5 pages (2 pages of English translation and 3 pages of PCT Search Report).

(Continued)

*Primary Examiner* — Anthony Ho
(74) *Attorney, Agent, or Firm* — Morrison & Foerster LLP

(57) ABSTRACT

An organic EL element (1) includes a three-layer-structured light-emitting layer (5). A first light-emitting layer (5a) is made of a host material higher in HOMO than an organic light-emitting material (|HOMO (host material for first light-emitting layer)|>|HOMO (phosphorescence-emitting material)|). A second light-emitting layer (5c) is made of a host material lower in LUMO than the organic light-emitting material (|LUMO (host material for second light-emitting layer) |<|LUMO (phosphorescence-emitting material)|). A third light-emitting layer (5b) is made of a material higher in HOMO and lower in LUMO than the organic light-emitting material (|HOMO (host material for third light-emitting layer)|>|HOMO (phosphorescence-emitting material)|, |LUMO (host material for third light-emitting layer) |<|LUMO (phosphorescence-emitting material)|). This ensures transferring holes and electrons to the third light-emitting layer (5c). Consequently, a recombination ratio between holes and electrons increases, a voltage for driving the organic EL element (1) decreases, and light-emitting efficiency increases.

15 Claims, 5 Drawing Sheets

(56) References Cited

OTHER PUBLICATIONS

Lee et al., "Suppression of Efficiency Roll off in Blue Phosphorescent Organic Light-Emitting Devices using Double Emission Layers with Additional Carrier-Transporting Material", Applied Physics Letters, vol. 94, 2009, pp. 083506-1-083506-3.

Watanabe et al., "Chemistry of Electron Transfer—Introduction to Electrochemistry", The Chemical Society of Japan 1st Edition, Apr. 25, 1996, 17 pages.

Tokito et al., "Organic Electroluminescence Display", Ohmsha Ltd., First Edition, 186 Pages.

ORGANIC ELECTROLUMINESCENCE ELEMENT, MANUFACTURING METHOD THEREOF, AND ORGANIC ELECTROLUMINESCENCE DISPLAY DEVICE

CROSS REFERENCE TO RELATED APPLICATIONS

This is a U.S. National Phase patent application of PCT/JP2010/067879, filed Oct. 12, 2010, which claims priority to Japanese Patent Application No. 2009-270820, filed Nov. 27, 2009, each of which is hereby incorporated by reference in the present disclosure in its entirety.

TECHNICAL FIELD

The present invention relates to an organic electroluminescence element which realizes high luminance, high efficiency, and a long life, a manufacturing method thereof, and an organic electroluminescence display device.

BACKGROUND ART

Recently, there is an increasing need for display devices such as thin flat panel displays (FPD) instead of display devices with a cathode-ray tube. There are many kinds of FPDs. Known examples of FPDs include non-self-luminous liquid crystal displays (LCD), self-luminous plasma display panels (PDP), inorganic electroluminescence (inorganic EL) displays, and organic electroluminescence (organic EL) displays.

Among them, organic EL displays use thin and light-weighted display elements (organic EL element), and have characteristics such as low voltage driving, high luminance, and being self-luminous. Accordingly, organic EL displays are actively researched and developed.

The organic EL elements are designed to include a pair of electrodes (cathode and anode) on a substrate and an organic layer which is provided between the pair of electrodes and which includes at least a light-emitting layer. The light-emitting layer is obtained by doping a host material with an organic light-emitting material. In general, a hole injection layer etc. obtained by doping a host material with acceptors is provided between the light-emitting layer and the cathode, and an electron injection layer etc. obtained by doping a host material with donor is provided between the light-emitting layer and the anode.

In the organic EL element, a voltage is applied across the cathode and the anode so that electron holes are injected from the cathode into the organic layer and electrons are injected from the anode to the organic layer. The electron holes and the electrons which have been injected from the electrodes recombine in the light-emitting layer to form an exciton. The organic EL element emits light using light radiated when the exciton decays.

In general, the light-emitting layer is made of an organic light-emitting material such as a phosphorescence-emitting material and a fluorescence-emitting material. Since the organic EL element using the phosphorescence-emitting element has advantages such as high light-emitting efficiency and a long life, the organic EL element using the phosphorescence-emitting material for the light-emitting layer has become widely used recently. Furthermore, in order to realize lower power consumption of the organic EL element, there has been developed an organic EL element to which a phosphorescence-emitting material whose internal quantum efficiency is 100% at most is introduced.

The organic EL element that emits red light and the organic EL element that emits green light employ phosphorescence-emitting materials whose internal quantum efficiency is 100% at most. However, the organic EL element that emits blue light does not employ a phosphorescence-emitting material whose internal quantum efficiency is 100% at most, and instead employs a phosphorescence-emitting material whose internal quantum efficiency is 25% at most.

The organic EL element requires higher energy in blue emission than in red emission and green emission. Furthermore, in order to obtain the energy from excited triplet level $(T_1)$, it is necessary to confine all of $T_1$, electrons, and electron holes into the phosphorescence-emitting material in the light-emitting layer. Accordingly, not only in the material constituting the light-emitting layer but also in the material surrounding the light-emitting layer, the gap between Highest Occupied Molecular Orbital (HOMO) and Lowest Unoccupied Molecular Orbital (LUMO) is required to be very large. However, since the gap between HOMO and LUMO of the light-emitting layer is required to be large, the host material for the light-emitting layer is difficult to be a material which has molecular conjugation, molecular interaction, and high mobility of carriers. Consequently, when a blue phosphorescence-emitting material is used, a high voltage is required for driving but light-emitting efficiency is low for the high voltage.

FIG. 8 shows a specific example of a conventional organic EL element 31 employing a blue phosphorescence-emitting material. FIG. 8 shows an energy diagram of individual layers constituting the conventional organic EL element 31 employing a blue phosphorescence-emitting material. In the drawing, the host material for an electron hole injection layer 33 is NPB (HOMO level=5.5 eV, LUMO level=2.4 eV), the host material for an electron hole transportation layer 34 is mCP (HOMO level=5.9 eV, LUMO level=2.4 eV), and the host material for an electron transportation layer 36 is 3TPYMB (HOMO level=6.8 eV, LUMO level=3.3 eV). The phosphorescence-emitting material for the light-emitting layer 35 is FIr6 (HOMO level=6.1 eV, LUMO level=3.1 eV). In order to confine electron holes and electrons to the FIr6, the host material for the light-emitting layer 35 is UGH2 having a wide gap between HOMO level and LUMO level (HOMO level=7.2 eV, LUMO level=2.8 eV). However, since UGH2 has a wide gap, it is impossible to efficiently transport electron holes from the electron hole transportation layer 34 to the light-emitting layer 35. Similarly, it is impossible to efficiently transport electrons from the electron transportation layer 36 to the light-emitting layer 35. Consequently, as described above, the organic EL element 31 employing a blue phosphorescence-emitting material requires a high voltage for driving the organic EL element 31 but exhibits low light-emitting efficiency for the high voltage.

As such, in order to improve light-emitting efficiency of the organic EL element employing a blue phosphorescence-emitting material, various ingenuities have been proposed. For example, Non-patent Literature 1 discloses an organic EL element including two light-emitting layers. Specifically, the organic EL element includes an organic layer consisting of an electron hole injection layer, a first light-emitting layer, a second light-emitting layer, and an electron injection layer in this order between a pair of electrodes. In Non-patent Literature 1, the host material for the electron hole injection layer is DTASi (HOMO level=5.6 eV, LUMO level=2.2 eV), and the host material for the electron injection layer is Bphen (HOMO level=6.4 eV, LUMO level=3.0 eV). Furthermore, the host material for the first light-emitting layer is 4CzPBP (HOMO level=6.0 eV, LUMO level=2.5 eV), and the host material for the second light-emitting layer is PPT (HOMO level=6.6 eV, LUMO level=2.9 eV). The first light-emitting layer and the second light-emitting layer are doped with FIrpic (HOMO level=5.8 eV, LUMO level=2.9 eV) which is a blue phosphorescence-emitting material.

This configuration provides an organic EL element whose gap between HOMO level and LUMO level in the first light-emitting layer and the second light-emitting layer is small. Accordingly, the light-emitting layer may be made of a host material that improves mobility of electron holes and electrons. This is because transportation of electron holes and electrons in an organic deposition film is made in the form of hopping conduction (Non-patent Literature 2). In order that transportation of electrons between molecules is made in the form of hopping conduction, wave functions of two electronic states, neutral state and radical anionic state, are required to overlap significantly. On the other hand, in order that transportation of electron holes between molecules is made in the form of hopping conduction, wave functions of two electronic states, neutral state and radical cationic state, are required to overlap significantly. That is, as stacking between the neutral state and the radical anionic state or stacking between the neutral state and the radical cationic state ($\pi$-$\pi$ interaction) is more significant, mobility of electron holes and electrons is higher. Furthermore, as the stacking is more significant, the gap between HOMO and LUMO is smaller. Accordingly, this configuration provides an organic EL element which can be driven by a low voltage of 4.6 V and which exhibits high light-emitting efficiency of 22 cd/A at 1000 cd/m$^2$.

CITATION LIST

Non-patent Literatures

[Non-patent Literature 1]
Applied Physics Letters 94, 083506, 2009
[Non-patent Literature 2]
"Organic EL Display", written by TOKITOU Shizuo, ADACHI chihaya, MURATA Hideyuki, published by Ohm-sha, Ltd., August 2004
[Non-patent Literature 3]
"Chemistry of Electron Transfer—Introduction to Electro-chemistry", written by WATANABE Tadashi, NAKABA-YASHI Seiichiro, edited by The Chemical Society of Japan, published by Asakura Publishing Co., Ltd. September 2005

SUMMARY OF INVENTION

Technical Problem

In the organic EL element disclosed in Non-patent Literature 1, when electrons are transported from the electron injection layer to the second light-emitting layer, the electrons are transported to the light-emitting dopant (FIrpic). However, in the organic EL element disclosed in Non-patent Literature 1, electrons are more likely to be transported from the light-emitting dopant to the first light-emitting layer. Consequently, electron holes and electrons do not recombine at the interface between the first light-emitting layer and the second light-emitting layer, so that the recombination ratio drops. That is, the internal quantum efficiency drops.

Furthermore, in the organic EL element disclosed in Non-patent Literature 1, the phosphorescence-emitting material for the first light-emitting layer and the second light-emitting layer is FIrpic that emits sky blue light. Since the gap between HOMO level and LUMO level of FIrpic is small, there is obtained an organic EL element with a low driving voltage and high light-emitting efficiency. Consequently, in a case of a phosphorescence-emitting material that emits deep blue light, the gap between HOMO level and LUMO level of such a phosphorescence-emitting material is large, so that a host material whose gap between HOMO level and LUMO level is large is required. Consequently, a high voltage is required for driving, but there still remains a problem that light-emitting efficiency is low for the high voltage.

The present invention was made in view of the foregoing problem. An object of the present invention is to provide an organic EL element driven by a low voltage and having high light-emitting efficiency, and a manufacturing method thereof.

Solution to Problem

In order to solve the foregoing problem, an organic electroluminescence element of the present invention includes: on a substrate, a cathode and an anode; and an organic layer between the cathode and the anode, the organic layer including at least a light-emitting layer, the light-emitting layer including: a first light-emitting layer which is positioned closer to the cathode and which is made of a first host material; a second light-emitting layer which is positioned closer to the anode and which is made of a second host material; and a third light-emitting layer which is positioned between the first light-emitting layer and the second light-emitting layer and which is made of a third host material, the first host material, the second host material, and the third host material being different from one another, and the first host material, the second host material, and the third host material being doped with a same organic light-emitting material, and the first host material, the second host material, the third host material, and the organic light-emitting material meeting equations (1) and (2) below in terms of Highest Occupied Molecular Orbital (HOMO) and Lowest Unoccupied Molecular Orbital (LUMO).

$$|\text{HOMO of the first host material}|>|\text{HOMO of the organic light-emitting material}| \text{ and } |\text{HOMO of the organic light-emitting material}|<|\text{HOMO of the third host material}| \quad (1)$$

$$|\text{LUMO of the second host material}|<|\text{LUMO of the organic light-emitting material}| \text{ and } |\text{LUMO of the organic light-emitting material}|>|\text{LUMO of the third host material}| \quad (2)$$

With the arrangement, the host material for the first light-emitting layer is a material whose Highest Occupied Molecular Orbital is higher than that of the organic light-emitting material. On the other hand, the host material for the second light-emitting layer is a material whose Lowest Unoccupied Molecular Orbital is lower than that of the organic light-emitting material. Since the organic light-emitting material has Highest Occupied Molecular Orbital lower than that of the host material for the first light-emitting layer, electron holes transferred to the first light-emitting layer are finally and completely transferred to the organic light-emitting material in the third light-emitting layer. Similarly, since the organic light-emitting material has Lowest Unoccupied Molecular Orbital higher than that of the host material for the second light-emitting layer, electrons transferred to the second light-emitting layer are finally and completely transferred to the organic light-emitting material in the third light-emitting layer. Thus, in the third light-emitting layer, the electron holes and the electrons transferred to the organic light-emitting layer recombine to emit light.

The host material for the third light-emitting layer is a material whose gap between Highest Occupied Molecular Orbital and Lowest Unoccupied Molecular Orbital is large. Consequently, it is possible to prevent electron holes having been transferred from the first light-emitting layer from moving to the second light-emitting layer. Similarly, it is possible to prevent electrons having been transferred from the second light-emitting layer from moving to the first light-emitting layer. Furthermore, since the gap between Highest Occupied Molecular Orbital and Lowest Unoccupied Molecular Orbital is large, mobility of electron holes and electrons in the light-emitting layer is low. Consequently, electron holes and electrons transferred to the third light-emitting layer can be confined to the third light-emitting layer, and since mobility of electron holes and electrons is low, the recombination ratio between electron holes and electrons can be increased.

Consequently, in the organic electroluminescence element (organic EL element) of the present invention, it is possible to efficiently and surely transfer electron holes and electrons to the third light-emitting layer. Furthermore, since the recombination ratio between electron holes and electrons can be increased, a voltage for driving the organic EL element can be decreased. Furthermore, since the recombination ratio between electron holes and electrons in the light-emitting layer is increased, the internal quantum efficiency increases, so that the light-emitting efficiency increases.

In order to solve the foregoing problem, an organic electroluminescence display device of the present invention includes display means in which the aforementioned organic electroluminescence element is formed on a thin film transistor substrate.

With the arrangement, since the display device includes an organic EL element which is driven by a low voltage and has high light-emitting efficiency, the display device exhibits high luminance, high efficiency, and a long life.

In order to solve the foregoing problem, a manufacturing method of the present invention of an organic electroluminescence element is a manufacturing method of an organic electroluminescence element including: on a substrate, a cathode and an anode; and an organic layer between the cathode and the anode, the organic layer including at least a light-emitting layer, the manufacturing method including: a cathode formation step of forming the cathode on the substrate; an electron hole injection layer formation step of forming, on the cathode, an electron hole injection layer to which electron holes are injected from the cathode; an electron hole transportation layer formation step of forming, on the electron hole injection layer, an electron hole transportation layer via which electron holes injected from the cathode to the organic layer are transported; a first light-emitting layer formation step of forming, on the electron hole transportation layer, a first light-emitting layer as the light-emitting layer, the first light-emitting layer being made of a first host material; a third light-emitting layer formation step of forming, on the first light-emitting layer, a third light-emitting layer as the light-emitting layer, the third light-emitting layer being made of a third host material; a second light-emitting layer formation step of forming, on the third light-emitting layer, a second light-emitting layer as the light-emitting layer, the second light-emitting layer being made of a second host material; an electron transportation layer formation step of forming, on the second light-emitting layer, an electron transportation layer via which electrons injected from the anode to the organic layer are transported; an electron injection layer formation step of forming, on the electron transportation layer, an electron injection layer to which electrons are injected from the anode; and an anode formation step of forming the anode on the electron injection layer, in the first light-emitting layer formation step, the second light-emitting layer formation step, and the third light-emitting layer formation step, the first host material, the second host material, and the third host material being different from one another, the first host material, the second host material, and the third host material being doped with a same organic light-emitting material, and the first host material, the second host material, the third host material, and the organic light-emitting material meeting equations (14) and (15) below in terms of Highest Occupied Molecular Orbital (HOMO) and Lowest Unoccupied Molecular Orbital (LUMO).

$$|\text{HOMO of the first host material}|>|\text{HOMO of the organic light-emitting material}| \text{ and } |\text{HOMO of the organic light-emitting material}|<|\text{HOMO of the third host material}| \quad (14)$$

$$|\text{LUMO of the second host material}|<|\text{LUMO of the organic light-emitting material}| \text{ and } |\text{LUMO of the organic light-emitting material}|>|\text{LUMO of the third host material}| \quad (15)$$

With the method, it is possible to provide an organic EL element which is driven by a low voltage and has high light-emitting efficiency.

For a fuller understanding of the nature and advantages of the invention, reference should be made to the ensuing detailed description taken in conjunction with the accompanying drawings.

Advantageous Effects of Invention

The organic electroluminescence element of the present invention is designed such that electron holes and electrons can be efficiently and surely transferred to the light-emitting layer. Furthermore, since the recombination ratio between electron holes and electrons can be increased, a voltage for driving the organic EL element can be decreased. Furthermore, since the recombination ratio between electron holes and electrons in the light-emitting layer is increased, the internal quantum efficiency increases, so that the light-emitting efficiency increases.

BRIEF DESCRIPTION OF DRAWINGS

FIG. 1 is a drawing showing an energy diagram of individual layers constituting an organic electroluminescence element in accordance with one embodiment of the present invention.

FIG. 2 is a drawing showing a cross section of an organic electroluminescence element in accordance with one embodiment of the present invention.

FIG. 3 is a drawing showing a relation between a thickness of a light-emitting layer and current efficiency in an organic electroluminescence element and a conventional organic electroluminescence element.

FIG. 4 is a drawing schematically showing an organic electroluminescence display device including an organic electroluminescence element in accordance with one embodiment of the present invention.

FIG. 5 is a drawing schematically showing a mobile phone including an organic electroluminescence display device in accordance with one embodiment of the present invention.

FIG. 6 is a drawing schematically showing a television receiver including an organic electroluminescence display device in accordance with one embodiment of the present invention.

FIG. 7 is a drawing schematically showing an illumination device including an organic electroluminescence element in accordance with one embodiment of the present invention.

FIG. 8 is a drawing showing an energy diagram of individual layers constituting a conventional organic EL element employing a blue phosphorescence-emitting material.

DESCRIPTION OF EMBODIMENTS (Summary of Organic EL Element 1)

Figure 2:
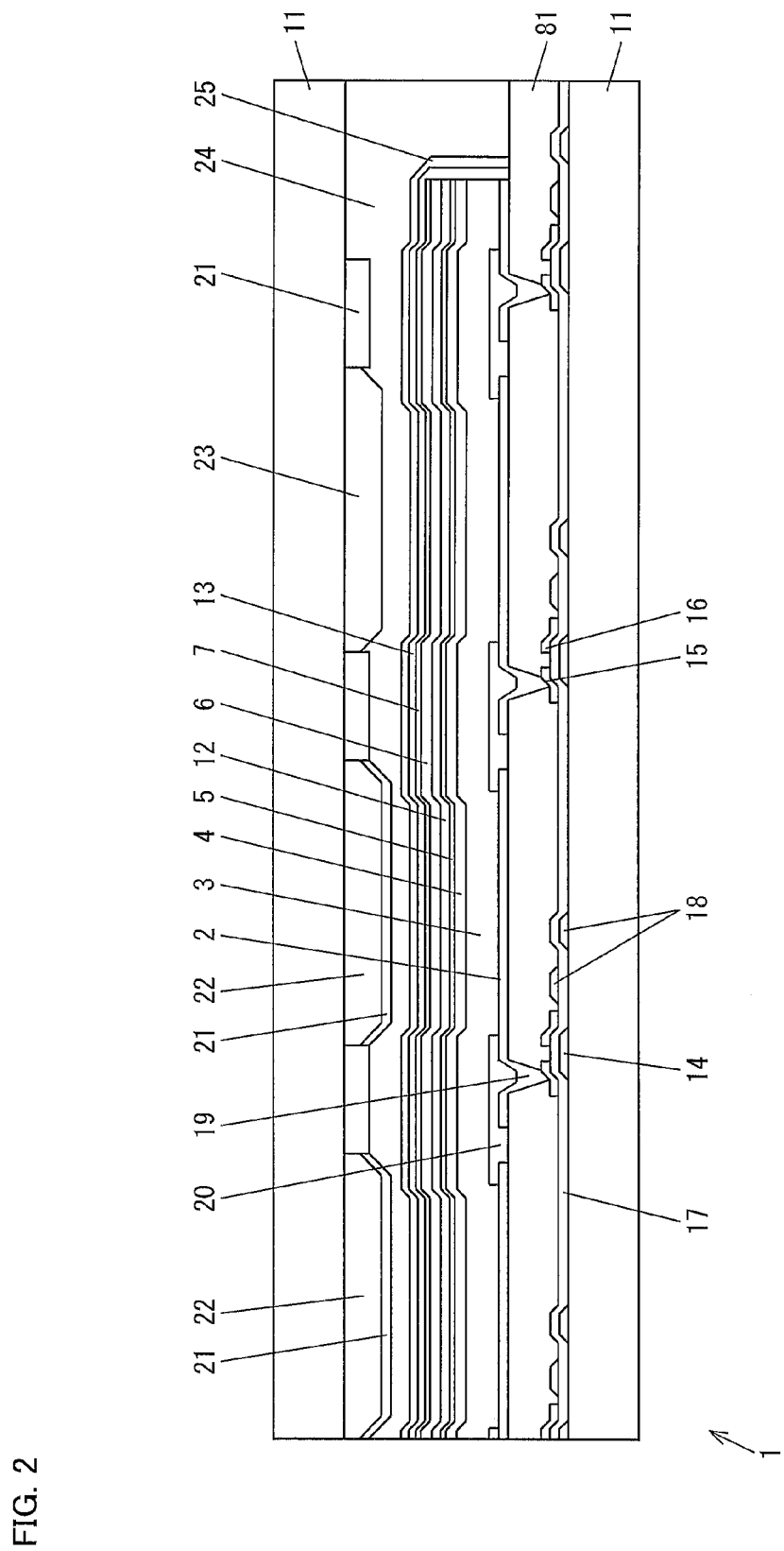
FIG. 2

An organic electroluminescence element (organic EL element) in accordance with the present embodiment includes a pair of electrodes (cathode and anode) and an organic layer including a light-emitting layer positioned between the pair of electrodes, all layered on a substrate. A more specific configuration is explained below with reference to FIG. 2. FIG. 2 is a drawing showing a cross section of an organic EL element 1.

As shown in FIG. 2, in the organic EL element 1, a plurality of thin film transistors (TFT) consisting of a gate electrode 14, a drain electrode 15, a source electrode 16, and a gate insulating film 17 are positioned on an insulating substrate 11 at a predetermined distance. Connection lines 18 extend from the insulating substrate 11 to the TFTs.

A planarizing layer 81 is provided on each TFT, and the planarizing layer 81 has contact holes 19 therein. The drain electrode 15 of each TFT is electrically connected with a cathode 2 via the contact hole 19. An edge cover 20 is provided between adjacent cathodes 2. On a side of the cathode 2 which side is opposite to the TFT, there is provided an organic layer consisting of an electron hole injection layer 3, an electron hole transportation layer 4, a light-emitting layer 5, an electron hole blocking layer 12, an electron transportation layer 6, and an electron injection layer 7, and an anode 13. The anode 13 is coated with an inorganic sealing film 25, so that the inorganic sealing film 25 seals the cathode 2, the organic layer, and the anode 13.

On the other hand, on an insulating substrate 11 opposite to the insulating substrate 11 on which the TFTs are provided, there are provided an optical absorption layer 21, a fluorescent material layer 22, and a diffusing material layer 23. Between the two insulating substrates 11, there is provided a resin sealing film 24.

The light-emitting layer 5 of the organic EL element 1 in accordance with the present embodiment has a three-layered structure consisting of a first light-emitting layer, a second light-emitting layer, and a third light-emitting layer. In particular, the host material for the light-emitting layer is designed such that the gap between Highest Occupied Molecular Orbital (HOMO) and Lowest Unoccupied Molecular Orbital (LUMO) of the host material is small. Furthermore, in the light-emitting layer, the third light-emitting layer is provided between the first light-emitting layer and the second light-emitting layer to serve as a region where electron holes and electrons recombine. Thus, it is possible to increase a recombination ratio between electron holes and electrons in the light-emitting layer while mobility of electron holes and electrons is kept high. This will be detailed later.

(Configuration of Organic Layer)

Figure 1:
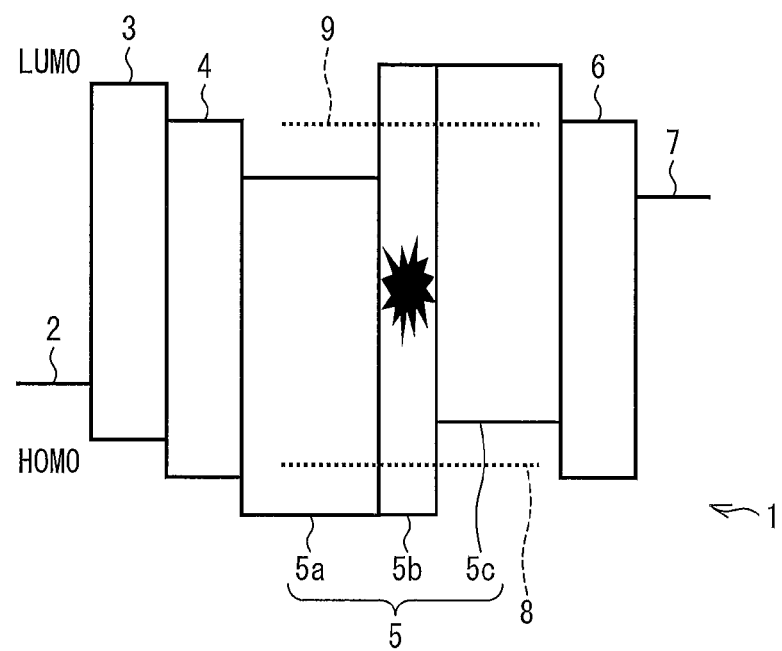
FIG. 1

With reference to FIG. 1, the following explains a configuration of the organic layer of the organic EL element 1. FIG. 1 is a drawing showing an energy diagram of individual layers constituting the organic EL element 1.

As described above, the organic layer of the organic EL element 1 is obtained by sequentially forming the electron hole injection layer 3, the electron hole transportation layer 4, the light-emitting layer 5, the electron transportation layer 6, and the electron injection layer 7. The light-emitting layer 5 has a three-layered structure consisting of a first light-emitting layer 5a, a second light-emitting layer 5c, and a third light-emitting layer 5b. The first light-emitting layer 5a, the second light-emitting layer 5c, and the third light-emitting layer 5b are doped with a single phosphorescence-emitting material (organic light-emitting material). The first light-emitting layer 5a is positioned closer to the cathode 2, and receives electron holes from the cathode 2 via the electron hole transportation layer 4, and transfers the electron holes to the third light-emitting layer 5b. On the other hand, the second light-emitting layer 5c is positioned closer to the anode (not shown), and receives electrons from the anode via the electron transportation layer 6, and transfers the electrons to the third light-emitting layer 5b. At the third light-emitting layer 5b positioned between the first light-emitting layer 5a and the second light-emitting layer 5c, the electron holes from the first light-emitting layer 5a and the electrons from the second light-emitting layer 5c recombine with each other to emit light.

Here, the organic EL element 1 in accordance with the present embodiment is designed such that electron holes are surely transferred from the first light-emitting layer 5a to the third light-emitting layer 5b and electrons are surely transferred from the second light-emitting layer 5c to the third light-emitting layer 5b. Specifically, as shown in FIG. 1, the host material for the first light-emitting layer 5a (first host material) is a material with a HOMO level higher than a HOMO level 8 of a phosphorescence-emitting material (|HOMO (first host material)|>|HOMO (phosphorescence-emitting material)|). On the other hand, the host material for the second light-emitting layer 5c (second host material) is a material with a LUMO level lower than a LUMO level 9 of a phosphorescence-emitting material (|LUMO (second host material)|<|LUMO (phosphorescence-emitting material)|). With this arrangement, the HOMO level 8 of the phosphorescence-emitting material is lower than the HOMO level of the host material for the first light-emitting layer 5a, so that the electron holes transferred to the first light-emitting layer 5a are finally and completely transferred to the phosphorescence-emitting material in the third light-emitting layer 5b. Similarly, the LUMO level 9 of the phosphorescence-emitting material is higher than the LUMO level of the host material for the second light-emitting layer 5c, so that electrons transferred to the second light-emitting layer 5c are finally and completely transferred to the phosphorescence-emitting material in the third light-emitting layer 5b. Thus, in the third light-emitting layer 5b, the electron holes and the electrons transferred to the phosphorescence-emitting material recombine with each other to emit light.

The host material for the third light-emitting layer 5b (third host material) is a material having a large gap between HOMO level and LUMO level. Specifically, the host material for the third light-emitting layer 5b has a HOMO level higher than the HOMO level 8 of the phosphorescence-emitting material (|HOMO (third host material)|>|HOMO (phosphorescence-emitting material)|) and has a LUMO level lower than the LUMO level 9 of the phosphorescence-emitting material (|LUMO (third host material)|<|LUMO (phosphorescence-emitting material)]). Consequently, it is possible to prevent electron holes having been transferred from the first light-emitting layer 5a from moving to the second light-emitting layer 5c. Similarly, it is possible to prevent electrons having been transferred from the second light-emitting layer 5c from moving to the first light-emitting layer 5a. Furthermore, since the gap between HOMO level and LUMO level is large, the mobility of electron holes and electrons in the light-emitting layer 5b is low. Accordingly, it is possible to confine electron holes and electrons having been transferred to the third light-emitting layer 5b to the third light-emitting layer 5b, and since the mobility of electron holes and electrons in the third light-emitting layer 5b is low, it is possible to increase a recombination ratio between electron holes and electrons.

As described above, the organic EL element 1 in accordance with the present embodiment includes the light-emitting layer 5 having a three-layered structure, and the host materials for the light-emitting layer 5 are determined in consideration of the HOMO level 8 and the LUMO level 9 of the phosphorescence-emitting material. Thus, it is possible to surely transfer electron holes from the cathode 2 to the third light-emitting layer 5b. Similarly, it is possible to surely transfer electrons from the anode to the third light-emitting layer 5b. Furthermore, the third light-emitting layer 5b is designed to have a large gap between HOMO level and LUMO level, so that it is possible to confine electron holes and electrons to the third light-emitting layer 5b. Consequently, it is possible to increase the recombination ratio between the electron holes and the electrons. Therefore, in the organic EL element 1 in accordance with the present embodiment, it is possible to efficiently transfer the electron holes and the electrons, so that it is possible to reduce a voltage required for driving the organic EL element 1. Furthermore, since it is possible to increase the recombination ratio between the electron holes and the electrons in the light-emitting layer 5, the internal quantum efficiency increases, so that the light-emitting efficiency increases.

A conventional organic EL element employing a blue phosphorescence-emitting material suffers a problem that light-emitting efficiency is low for a high voltage required for driving the organic EL element. In contrast thereto, the present embodiment can efficiently transfer electron holes and electrons to the third light-emitting layer 5b even when a blue phosphorescence-emitting material is employed. That is, it is possible to increase a recombination ratio between electron holes and electrons. Accordingly, it is possible to increase internal quantum efficiency of the organic EL element 1, so that it is possible to increase light-emitting efficiency.

(Substrate of Organic EL Element 1)

In the following, an explanation is made as to members constituting the organic EL element 1. As described above, the organic EL element 1 includes, between the cathode 2 and the anode each on the substrate (not shown), the organic layer consisting of the electron hole injection layer 3, the electron hole transportation layer 4, the light-emitting layer 5, the electron transportation layer 6, and the electron injection layer 7.

Initially, an explanation is made as to the substrate. The substrate for the organic EL element 1 may be any substrate as long as it has an insulating property. The material usable as the substrate of the organic EL element 1 is not particularly limited and may be a publicly known insulating substrate material for example.

Examples of the substrate include inorganic material substrates made of glass, silicon dioxide etc., and plastic substrates made of polyethylene terephthalate, polyimide resin etc. Another example of the substrate is a one obtained by coating a metal substrate made of aluminum (Al), iron (Fe) etc. with an insulating material made of silicon oxide, an organic insulating material etc. Alternatively, the substrate may be a one obtained by subjecting the surface of a metal substrate made of Al etc. to an insulating process through a method such as anodic oxidation.

In a case where light from the light-emitting layer 5 of the organic EL element 1 is taken out of a side opposite to the substrate, i.e. in a case of a top emission type, the substrate is desirably made of a non-light-transmitting material. For example, the substrate may be a semiconductor substrate made of silicon wafer etc. In contrast, in a case where light from the light-emitting layer 5 of the organic EL element 1 is taken out of a side closer to the substrate, i.e. in a case of a bottom emission type, the substrate is desirably made of a light-transmitting material. For example, the substrate may be a glass substrate, a plastic substrate etc.

(Electrodes of Organic EL Element 1)

Next, an explanation is made as to electrodes. The electrodes included in the organic EL element 1 should serve as a pair such as the cathode 2 and the anode.

Each electrode may have a single-layered structure made of one electrode material, or may have a laminate structure made of a plurality of electrode materials. The electrode material usable as the electrode of the organic EL element 1 is not particularly limited, and may be a publicly known electrode material.

Examples of the material for the cathode 2 include metals such as gold (Au), platinum (Pt), and nickel (Ni), and transparent electrode materials such as indium tin oxide (ITO), tin oxide ($SnO_2$), and indium zinc oxide (IZO).

On the other hand, examples of the material for the anode include metals such as lithium (Li), calcium (Ca), cerium (Ce), barium (Ba), and aluminum (Al), and alloys containing these metals such as magnesium (Mg): silver (Ag) alloy and Li: Al alloy.

Light from the light-emitting layer 5 of the organic EL element 1 must be taken out of one of the cathode 2 and the anode. In this case, it is preferable that one electrode is made of a light-transmitting electrode material and the other electrode is made of a non-light-transmitting electrode material. Examples of the non-light-transmitting electrode material include black electrodes such as tantalum and carbon, and reflective metal electrodes such as Al, Ag, Au, Al: Li alloy, Al: neodymium (Nd) alloy, and Al: silicon (Si) alloy.

(Organic Layer of Organic EL element 1)

Next, an explanation is made as to the organic layer. The organic layer includes the electron hole injection layer 3, the electron hole transportation layer 4, the light-emitting layer 5, the electron transportation layer 6, and the electron injection layer 7.

Initially, the light-emitting layer 5 is described. As described above, the light-emitting layer 5 has a three-layered structure consisting of the first light-emitting layer 5a, the second light-emitting layer 5c, and the third light-emitting layer 5b. Each layer is doped with a single phosphorescence-emitting material. The phosphorescence-emitting material for the light-emitting layer 5 is not particularly limited, and may be a publicly known phosphorus light-emitting material for example.

Examples of the blue phosphorescence-emitting material include Ir complexes such as iridium(III)bis(4',6'-difluorophenylpyridinato)tetrakis(1-pyrazolyl)borate (FIr6) (HOMO level=6.1 eV, LUMO level=3.1 eV, $T_1$=2.71 eV), iridium(III)bis[4,6-(di-fluorophenyl)-pyridinato-N, C2']picolinate (FIrpic), iridium(III)tris[N-(4'-cyanophenyl)-N'-methylimidazole-2-ylidene-C2, C2'] (Ir(cn-pmic)$_3$), tris((3,5-difluoro-4-cyanophenyl)pyridine)iridium (FCNIr), and Ir(cnbic)$_3$, and complexes of heavy atom metals such as platinum (Pt), rhenium (Re), ruthenium (Ru), copper (Cu), and osmium (Os).

As described above, in order that electron holes are surely transferred from the first light-emitting layer 5a to the third light-emitting layer 5b, the host material for the first light-emitting layer 5a is a material whose HOMO level is more stable than the HOMO level 8 of the phosphorescence-emitting material. Accordingly, the host material for the first light-emitting layer 5a preferably has HOMO level and LUMO level which are similar to HOMO level and LUMO level, respectively, of a host material conventionally used as an electron transporting material. Thus, it is possible to surely transport electron holes from the first light-emitting layer 5a to the third light-emitting layer 5b. Furthermore, in order to confine excitation energy to the phosphorescence-emitting material, the host material is preferably a material whose excited triplet level ($T_1$) is larger than that of the phosphorescence-emitting material for the light-emitting layer 5. However, it should be noted that even when the host material has $T_1$ smaller than that of the phosphorescence-emitting material, a difference in $T_1$ between the host material and the phosphorescence-emitting material being approximately 0.1 eV is not likely to cause transfer of excitation energy from the phosphorescence-emitting material. Accordingly, the host material whose $T_1$ is smaller by approximately 0.1 eV than $T_1$ of the phosphorescence-emitting material is usable.

Examples of the host material for the first light-emitting layer 5a include, but not particularly limited to, tris(2,4,6-trimethyl-3-(pyridine-3-il)phenyl)borane (3TPYMB) (HOMO level=6.8 eV, LUMO level=3.3 eV, $T_1$=2.98 eV), and 1,3,5-tri(m-pyridi-3-il-phenyl)benzene (TmTyPB) (HOMO level=6.68 eV, LUMO level=2.73 eV, $T_1$=2.78 eV).

Similarly, in order that electrons are surely transferred from the second light-emitting layer 5c to the third light-emitting layer 5b, the host material constituting the second light-emitting layer 5c is a material whose LUMO level is less stable than the LUMO level 9 of the phosphorescence-emitting material. Accordingly, the host material for the second light-emitting layer 5c preferably has HOMO level and LUMO level which are similar to HOMO level and LUMO level, respectively, of a host material conventionally used as an electron hole transporting material. Thus, it is possible to surely transport electrons from the second light-emitting layer 5c to the third light-emitting layer 5b. Furthermore, in order to confine excitation energy to the phosphorescence-emitting material, the host material is preferably a material whose $T_1$ is larger than that of the phosphorescence-emitting material for the light-emitting layer 5. However, it should be noted that even when the host material has $T_1$ smaller than that of the phosphorescence-emitting material, a difference in $T_1$ between the host material and the phosphorescence-emitting material being approximately 0.1 eV is not likely to cause transfer of excitation energy from the phosphorescence-emitting material. Accordingly, the host material whose $T_1$ is smaller by approximately 0.1 eV than $T_1$ of the phosphorescence-emitting material is usable. Examples of the host material for the second light-emitting layer 5c include, but not particularly limited to, 1,3-bis(carbazole-9-il)benzene (mCP) (HOMO level=5.9 eV, LUMO level=2.4 eV, $T_1$=2.9 eV) and adamantane carbazole (Ad-Cz) (HOMO level=5.8 eV, LUMO level=2.6 eV, $T_1$=2.88 eV).

As described above, in order that electron holes and electrons are confined to the third light-emitting layer 5b, the host material for the light-emitting layer 5b has HOMO level higher than HOMO level 8 of the phosphorescence-emitting material and LUMO level smaller than the LUMO level 9 of the phosphorescence-emitting material. Examples of the material include sulfonated poly(2, 6-dimethyl-1 ,4-phenyleneoxide) (SPPO1) (HOMO level=6.5 eV, LUMO level=2.7 eV, $T_1$=2.9 eV) and Si-series host material or P-series host material whose gap between HOMO level and LUMO level is large. Examples of the Si-series host material include diphenyldi(o-tolyl)silane (UGH1) (HOMO level=7.2 eV, LUMO level=2.6 eV, $T_1$=3.15 eV), p-bis(triphenylsilyl)benzene (UGH2), 3,5-di(N-carbazolyl)tetraphenylsilane (SimCP), 3,5-di(9H-carbazole-9-il)tetraphenylsilane (SimCP2), and 9-(4-tert-butylphenyl)-3,6-bis(triphenylsilyl)-9H-carbazole (CzSi) (HOMO level=6.0 eV, LUMO level=2.5 eV, $T_1$=3.02 eV). On the other hand, examples of the P-series host material include PO1,2,8-bis(diphenylphosphoryl)dibenzothiophene (PPT) (HOMO level=6.6 eV, LUMO level=2.9 eV, $T_1$=3.0 eV), and 4-(diphenylphosphoryl)-N,N-diphenylaniline (HM-A1). In addition, 2,2-bis[(4-benzoyloxy)phenyl]propane (MMA1), 2,2-bis(4-carbazoylphenyl)-1,1-biphenyl (4CzPBP), 4,4'-dichlorobenzophenone (BCBP), 3,7-bis[4-(N-carbazolyl)phenyl]benzo[1,2-b4, 5-b0]difuran (CZBDP), (4-bromophenyl)-5-mercapto-1,2,3,4-tetrazole (BPMT) etc. are applicable. Furthermore, in order to confine excitation energy to the phosphorescence-emitting material, it is preferable to use the host material whose $T_1$ is larger than that of the phosphorescence-emitting material for the light-emitting layer 5. However, it should be noted that even when the host material has $T_1$ smaller than that of the phosphorescence-emitting material, a difference in $T_1$ between the host material and the phosphorescence-emitting material being approximately 0.1 eV is not likely to cause transfer of excitation energy from the phosphorescence-emitting material. Accordingly, the host material whose $T_1$ is smaller by approximately 0.1 eV than $T_1$ of the phosphorescence-emitting material is usable.

In the above, explanations were made as to the host materials usable for the first light-emitting layer 5a, the second light-emitting layer 5c, and the third light-emitting layer 5b. However, the host materials are not limited to the aforementioned ones. For example, after determining what phosphorescence-emitting material is to be used for the organic EL element 1, suitable host materials that meet the above conditions may be selected and used for individual light-emitting layers. That is, as long as the host materials meet the above conditions, the host materials are not limited to the aforementioned ones. Accordingly, the host materials to be used may be determined in consideration of the combination of the host materials for individual layers of the organic EL element 1, the phosphorescence-emitting material for the organic EL element 1 etc. The number of the host materials to be used is not limited to three, and may be more than three.

Next, an explanation is made as to the electron hole injection layer 3. The electron hole injection material usable for the electron hole injection layer 3 is not particularly limited, and may be a publicly known electron hole injection material. Examples thereof include 4,4'-bis[N-(1-naphthyl)-N-phenyl-amino]biphenyl (α-NPD), di-[4-(N,N-ditolyl-amino)-phenyl]cyclohexane (TAPC) (HOMO level=5.5 eV, LUMO level=1.8 eV, $T_1$=2.87 eV), 9,10-diphenylanthracene-2-sulfonate (DPAS), N,N'-diphenyl-N,N'-(di(3-tolyl)amino)phenyl)-1,1'-biphenyl-4,4'-diamine (DNTPD), iridium(III)tris [N,N'-diphenylbenzimidazole-2-ylidene-C2,C2'] (Ir(dpbic)$_3$),4,4',4"-tris-(N-carbazolyl)-triphenylamine (TCTA), 2,2-bis(p-trimellitic oxyphenyl)propanoic anhydride (BTPD), bis[4-(p,p-ditlylamino)phenyl]diphenylsilane (DTASi), and the host materials for the second light-emitting layer 5c.

Next, an explanation is made as to the electron hole transportation layer 4. The electron hole transportation material usable for the electron hole transportation layer 4 is not particularly limited, and may be a publicly known electron hole transportation material for example. Examples thereof include TAPC, DPAS, DNTPD, Ir(dpbic)3, TCTA, BTPD, DTASi, and the host materials for the second light-emitting layer 5c.

Next, an explanation is made as to the electron transportation layer 6. The electron transportation material usable for the electron transportation layer 6 is not particularly limited, and may be a publicly known electron transportation material for example. Examples thereof include 2,9-dimethyl-4,7-diphenyl-1,10-phenanthroline (BCP), 1,3,5-tris(N-phenyl-benzimidazole-2-il)benzene (TPBI), 3-phenyl-4(1'-naphthyl)-5-phenyl-1,2,4-triazole (TAZ), 4,7-diphenyl-1,10-phenanthroline (BPhen), Ad-Cz, dipalmitoyl phosphatidyl serine (DPPS), 1,3,5-tri(m-pyrido-3-il-phenyl)benzene (TmPyPB), 1,3,5-tri(p-pyrido-3-il-phenyl)benzene (TpPyPB), and the host material for the first light-emitting layer 5a.

Lastly, an explanation is made as to the electron injection layer 7. The electron injection material usable for the electron injection layer 7 is not particularly limited, and may be a publicly known electron injection material for example. Examples thereof include LiF, BCP, TPBI, TAZ, Bphen, Ad-Cz, DPPS, TmPyPB, TpPyPB, and the host materials for the first light-emitting layer 5a.

(Step of Producing Organic EL Element 1)

The following briefly explains the step of producing the organic EL element 1. Although the organic EL element normally includes a transistor as a switching element as described above, the present embodiment does not mention the step of producing the transistor.

In the following, an explanation is made as to the respective steps of forming the cathode 2, the organic layer, and the anode on a substrate on which a plurality of transistors are formed to have an island shape. Initially, the cathode 2 is pattern-formed on each transistor (cathode formation step). Then, individual layers of the organic layer are formed on the cathode 2 thus formed. In order to secure insulating property around the cathode 2, an organic insulating film (not shown) may be provided around the cathode 2. The material for the organic insulating film is preferably a resin material etc. such as polyimides, but is not limited to them, and may be a publicly known organic insulating material for example.

Then, the electron hole injection layer 3 is formed (electron hole injection layer formation step). The electron hole injection material is deposited on the cathode 2. Here, the thickness of the electron hole injection layer 3 is preferably approximately 45 nm. Thus, the electron hole injection layer 3 is formed.

Subsequently, the electron hole transportation layer 4 is formed (electron hole transportation layer formation step). The electron hole transportation material is deposited on the electron hole injection layer 3. Here, the thickness of the electron hole transportation layer 4 is preferably approximately 15 nm. Thus, the electron hole transportation layer 4 is formed.

Subsequently, the light-emitting layer 5 is formed. Specifically, the host material for the first light-emitting layer 5a and the phosphorescence-emitting material are codeposited on the electron hole transportation layer 4 (first light-emitting layer formation step). Here, it is preferable that the host material is doped with approximately 7.5% of the phosphorescence-emitting material. Thus, the first light-emitting layer 5a is formed. The thickness of the first light-emitting layer 5a is preferably approximately 10 nm.

Figure 3:
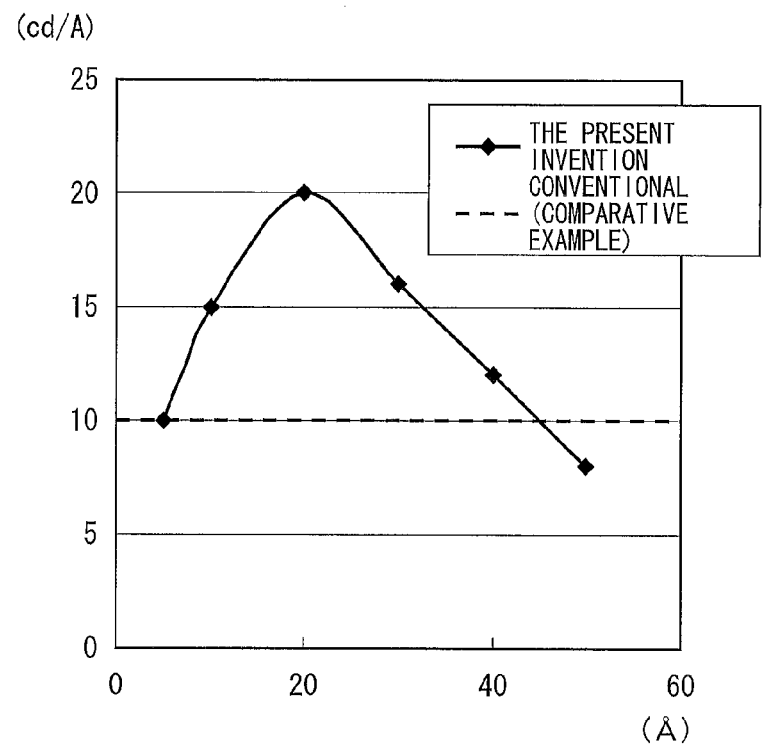
FIG. 3

Subsequently, the host material for the third light-emitting layer 5b and the phosphorescence-emitting material are codeposited on the first light-emitting layer 5a (third light-emitting layer formation step). Here, it is preferable that the host material is doped with approximately 7.5% of the phosphorescence-emitting material. Thus, the third light-emitting layer 5b is formed. The thickness of the third light-emitting layer 5b is preferably approximately 0.5 to 4 nm, and more preferably approximately 2 nm. This is detailed below with reference to FIG. 3. FIG. 3 is a drawing showing a relation between the thickness of a light-emitting layer and current efficiency in the organic EL element 1 and a conventional organic EL element. The longitudinal axis indicates current efficiency and the lateral axis indicates the thickness of the light-emitting layer. The thickness of the organic EL element 1 in FIG. 3 is the thickness of the third light-emitting layer 5b.

As shown in FIG. 3, when the thickness of the third light-emitting layer 5b of the organic EL element 1 is approximately 20 Å, the current efficiency exhibits a high peak. As the thickness of the third light-emitting layer 5b is smaller than 20 Å, the current efficiency decreases, and as the thickness of the third light-emitting layer 5b is larger than 20 Å, the current efficiency decreases. This is because when the thickness of the third light-emitting layer 5b is large, mobility of electron holes and electrons in the third light-emitting layer 5b is low, so that the recombination ratio between the electron holes and the electrons decreases. Accordingly, the thickness of the third light-emitting layer 5b is preferably smaller. However, if the thickness of the third light-emitting layer 5b is too small, electron holes having been transferred from the first light-emitting layer 5a move to the second light-emitting layer 5c, and similarly electrons having been transferred from the second light-emitting layer 5c move to the first light-emitting layer 5a. Consequently, the recombination ratio between the electron holes and the electrons in the third light-emitting layer 5b decreases as shown in FIG. 3. For this reason, the thickness of the third light-emitting layer 5b is preferably 5 to 42 Å (0.5 to 4.2 nm). With this configuration, the organic EL element 1 exhibits higher current efficiency than a conventional organic EL element (later-mentioned Comparative Example). Furthermore, it is desirable that the thickness of the third light-emitting layer 5b is 10 to 30 Å. In this range, the organic EL element 1 exhibits current efficiency 1.5 times higher than that of the conventional organic EL element. Thus, the organic EL element 1 with high efficiency can be obtained.

However, the current efficiency of the organic EL element 1 is influenced by the gap between HOMO level and LUMO level of the host material and the phosphorescence-emitting material which are used in the organic EL element 1, and difference in mobility between electron holes and electrons in the host material and the phosphorescence-emitting material which are used in the organic EL element 1. Therefore, the optimal thickness of the third light-emitting layer 5b should be determined in consideration of these factors, and so the thickness of the third light-emitting layer 5b is not necessarily limited to the above range.

Subsequently, the host material for the second light-emitting layer 5c and the phosphorescence-emitting material are codeposited on the third light-emitting layer 5b (second light-emitting layer formation step). Here, it is preferable that the host material is doped with approximately 7.5% of the phosphorescence-emitting material. Thus, the second light-emitting layer 5c is formed. The thickness of the second light-emitting layer 5c is preferably approximately 30 nm. As described above, the light-emitting layer 5 including the first light-emitting layer 5a, the second light-emitting layer 5c, and the third light-emitting layer 5b is formed.

Subsequently, the electron transportation layer 6 is formed (electron transportation layer formation step). The electron transportation material is deposited on the light-emitting layer 5. Here, the thickness of the electron transportation layer 6 is preferably approximately 10 nm. Thus, the electron transportation layer 6 is formed.

Subsequently, the electron injection layer 7 is formed (electron injection layer formation step). The electron injection material is deposited on the electron transportation layer 6. Thus, the electron injection layer 7 is formed.

Lastly, the anode is formed (anode formation step). The anode is pattern-formed on the electron injection layer 7. Thus, the organic EL element 1 is completed.

The present invention is not limited to the description of the embodiments above, but may be altered by a skilled person within the scope of the claims. An embodiment based on a proper combination of technical means disclosed in different embodiments is encompassed in the technical scope of the present invention.

For example, in the above embodiment, an explanation was made as to a case where the phosphorescence-emitting material is a blue phosphorescence-emitting material. Alternatively, a phosphorescence-emitting material other than blue one may be used, or other organic light-emitting material such as a fluorescence emitting material may be used. Application of an organic light-emitting material other than the blue phosphorescence-emitting material to the organic EL element 1 in accordance with the present embodiment also realizes further decrease in a voltage for driving the organic EL element 1.

Furthermore, each of the electron hole injection layer 3 and the electron injection layer 7 may be doped with a dopant. Furthermore, each of the electron hole transportation layer 4 and the electron transportation layer 6 may be doped with a dopant in order to facilitate transportation of electron holes and electrons. For example, the first light-emitting layer 5a may be doped with a dopant such as a p-dopant so that the first light-emitting layer 5a doubles as the electron hole injection layer 3 and the electron hole transportation layer 4. Similarly, the second light-emitting layer 5b may be doped with a dopant such as an n-dopant so that the second light-emitting layer 5b doubles as the electron transportation layer 6 and the electron injection layer 7. This simplifies a layered structure of the organic EL element 1, so that a production process can be simplified. Furthermore, since the injection layers and the transportation layers can be omitted, the cost for producing the organic EL element 1 can be reduced.

Figure 4:
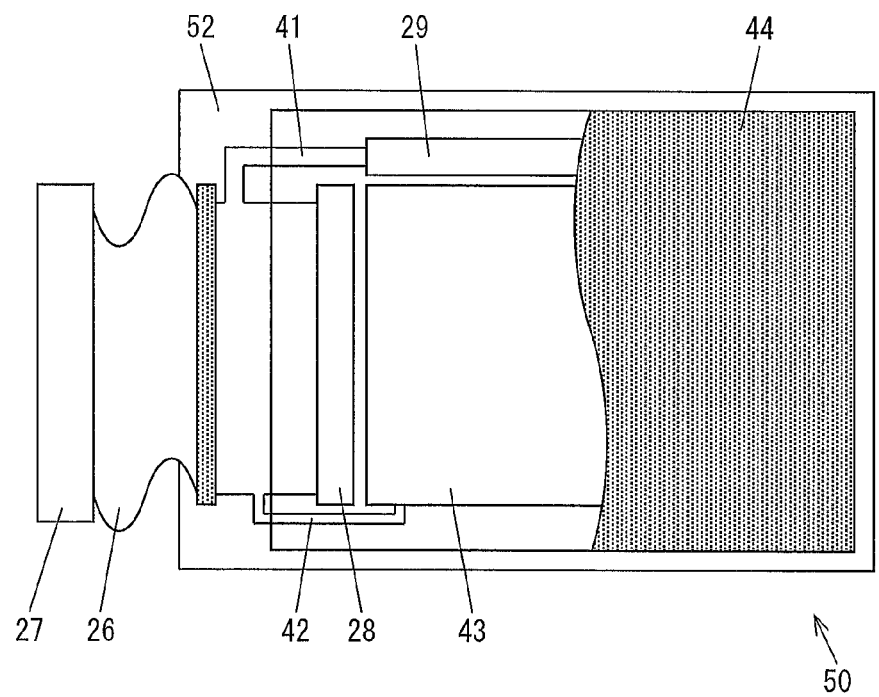
FIG. 4

Furthermore, it is possible to realize an organic EL display device having display means including the organic EL element 1 in accordance with the present embodiment. A specific example thereof is shown in FIG. 4. FIG. 4 is a drawing schematically showing an organic EL display device 50 including the organic EL element 1.

As shown in FIG. 4, the organic EL display device 50 including the organic EL element 1 includes, on a substrate 52, a pixel section 43, a gate signal side driving circuit 28, a data signal side driving circuit 29, wiring 41, a current supply line 42, a sealing substrate 44, FPC (Flexible Printed Circuits) 26, and an external driving circuit 27.

The external driving circuit 27 causes the gate signal side driving circuit 28 to sequentially select scanning lines (scan lines) of the pixel section 43 and causes the data signal side driving circuit 29 to write pixel data in pixel elements positioned along the selected scan line. That is, the gate signal side driving circuit 28 sequentially drives the scan lines and the data signal side driving circuit 29 outputs pixel data to data lines, so that pixel elements positioned at intersections between the driven scan line and the data lines to which data are outputted are driven.

Furthermore, it is possible to realize an electronic apparatus including the above organic EL display device. Specific examples thereof are shown in FIGS. 5 and 6.

Figure 5:
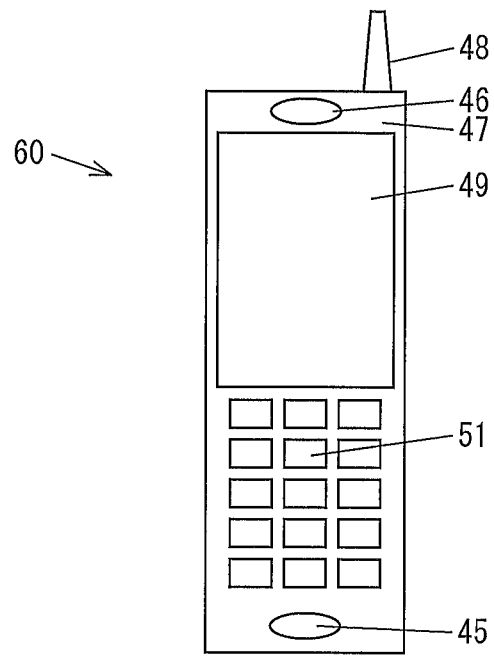
FIG. 5

FIG. 5 is a drawing schematically showing a mobile phone 60 including the organic EL display device. FIG. 6 is a drawing schematically showing a television receiver 70 including the organic EL display device. As shown in FIG. 5, a display section 49 of the mobile phone 60 may include the organic EL display device including the organic EL element 1 in accordance with the present embodiment. A reference numeral 45 in the drawing indicates an audio input section, 46 indicates an audio output section, 47 indicates a main body, 48 indicates an antenna, and 51 indicates operation switches. These members have the same functions as those in a conventional mobile phone and therefore explanations thereof are omitted here. A specific configuration of the mobile phone 60 is not mentioned here.

Figure 6:
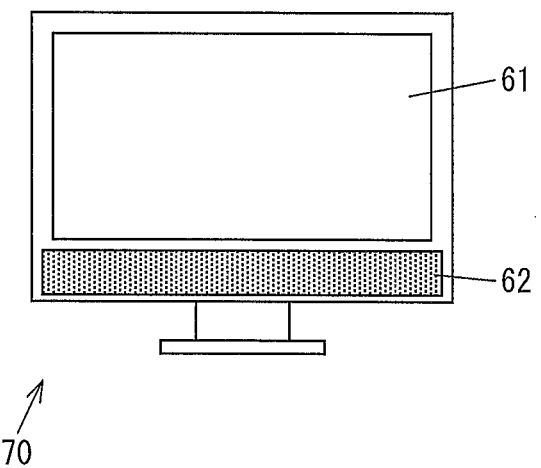
FIG. 6

As shown in FIG. 6, a display section 61 of the television receiver 70 may include the organic EL display device including the organic EL element 1 in accordance with the present embodiment. A reference numeral 62 in the drawing indicates a speaker. The television receiver 70 has the same configuration as that of a conventional television receiver 70 except that the display section 61 includes the organic EL display device in accordance with the present embodiment, and therefore a specific configuration of the television receiver 70 is not mentioned here.

As described above, inclusion of the organic EL element 1 in accordance with the present embodiment realizes an organic EL display device having high light-emitting efficiency, and the organic EL display device can be mounted on various electronic apparatuses including a display section.

Figure 7:
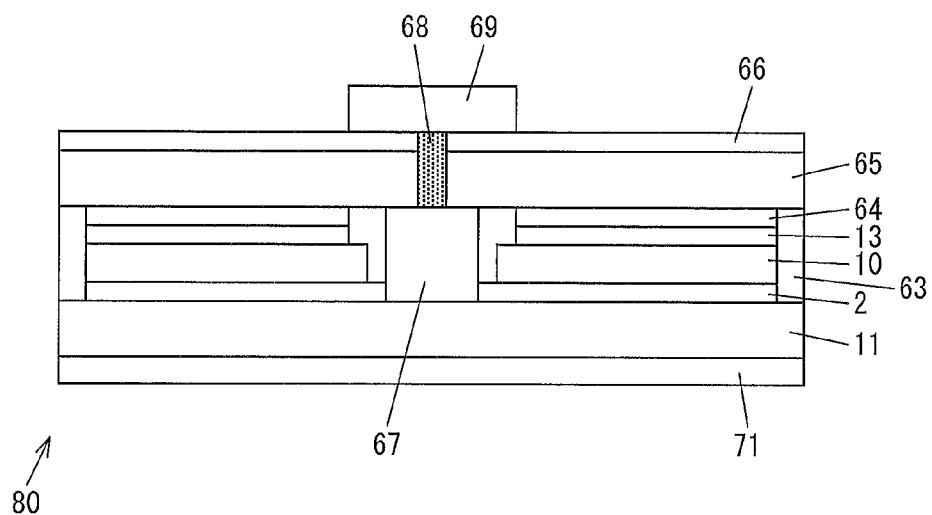
FIG. 7
Figure 8:
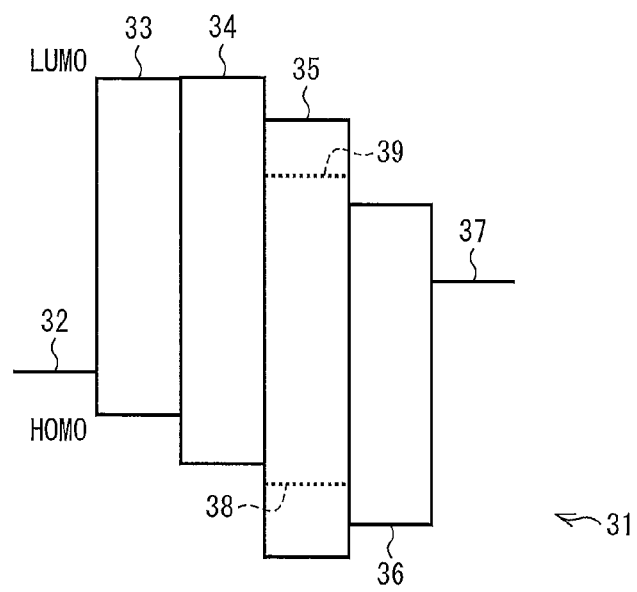
FIG. 8

In the above, an explanation was made as to the organic EL display device having display means including the organic EL element 1 in accordance with the present embodiment. Alternatively, the organic EL element 1 may be used as a light source of an illumination device. A specific example thereof is shown in FIG. 7. FIG. 7 is a drawing schematically showing an illumination device 80 including the organic EL element 1.

As shown in FIG. 7, the illumination device 80 including the organic EL element 1 includes an optical film 71, a substrate 11, a cathode 2, an organic EL layer 10, an anode 13, a heat diffusing seat 64, a sealing substrate 65, a sealing resin 63, a heat releasing member 66, a driving circuit 67, wiring 68, and a hook sealing 69. As described above, inclusion of the organic EL element 1 in accordance with the present embodiment can provide an illumination device having high light-emitting efficiency.

[Summary of Embodiment]

As described above, the organic electroluminescence element of the present invention is arranged such that the first host material, the second host material, and the organic light-emitting material meet equations (3) and (4) below in terms of Highest Occupied Molecular Orbital (HOMO) and Lowest Unoccupied Molecular Orbital (LUMO).

$$|\text{LUMO of the first host material}| > |\text{LUMO of the organic light-emitting material}| \quad (3)$$

$$|\text{HOMO of the second host material}| < |\text{HOMO of the organic light-emitting material}| \quad (4)$$

Furthermore, the organic electroluminescence element of the present invention is arranged such that the first host material, the second host material, and the third host material each have an excited triplet level higher than an excited triplet level of the organic light-emitting material.

With the arrangements, it is possible to confine excitation energy to the organic light-emitting material in the light-emitting layer, so that it is possible to prevent the excitation energy from moving from the organic light-emitting material.

The organic electroluminescence element of the present invention is arranged such that the first host material, the second host material, and the third host material meet equations (5) and (6) below in terms of electron hole mobility and electron mobility.

Electron hole mobility of the first host material>electron hole mobility of the third host material (5)

Electron mobility of the second host material>electron mobility of the third host material (6)

The organic electroluminescence element of the present invention is arranged such that the first host material, the second host material, and the third host material meet equations (7) and (8) below in terms of thickness.

Thickness of the first light-emitting layer>thickness of the third light-emitting layer, and thickness of the third light-emitting layer<thickness of the second light-emitting layer (7)

5 Å<thickness of the third light-emitting layer<42 Å (8)

The organic electroluminescence element of the present invention is arranged such that the third light-emitting layer meets equation (9) below in terms of thickness.

10 Å<thickness of the third light-emitting layer<30 Å (9)

The organic electroluminescence element of the present invention is arranged such that the first host material, the second host material, and the organic light-emitting material meet at least one of equations (10) and (11) below in terms of Highest Occupied Molecular Orbital (HOMO) and Lowest Unoccupied Molecular Orbital (LUMO).

0 eV<(|LUMO of the first host material|−|LUMO of the organic light-emitting material|)≤0.5 eV (10)

0 eV<(|HOMO of the organic light-emitting material|−|HOMO of the second host material|)≤0.5 eV (11)

The organic electroluminescence element of the present invention is arranged such that the first host material, the second host material, and the organic light-emitting material meet at least one of equations (12) and (13) below in terms of Highest Occupied Molecular Orbital (HOMO) and Lowest Unoccupied Molecular Orbital (LUMO).

0.1 eV≤(|LUMO of the first host material|−|LUMO of the organic light-emitting material|)≤0.3 eV (12)

0.1 eV (|HOMO of the organic light-emitting material|−|HOMO of the second host material|)≤0.3 eV (13)

The organic electroluminescence element of the present invention is arranged such that the organic layer includes an electron hole injection layer doped with a dopant for facilitating injection of electron holes from the cathode to the organic layer, and an electron injection layer doped with a dopant for facilitating injection of electrons from the anode to the organic layer.

With the arrangements, injection of carriers from a first electrode to the organic layer is facilitated, and injection of carriers from a second electrode to the organic layer is facilitated. Consequently, it is possible to sufficiently transfer electron holes and electrons to the light-emitting layer.

The organic electroluminescence element of the present invention is arranged such that between the electron hole injection layer and the light-emitting layer, there is provided a region which is not doped with the dopant and the organic light-emitting material.

The organic electroluminescence element of the present invention is arranged such that between the electron injection layer and the light-emitting layer, there is provided a region which is not doped with the dopant and the organic light-emitting material.

With the arrangements, the region which is not doped with the organic light-emitting material and the dopant between the light-emitting layer and the first carrier injection layer serves as a layer for blocking carriers. Consequently, it is possible to prevent energy deactivation etc. due to exciplexes etc. at the interface between the light-emitting layer and the first carrier injection layer. That is, it is possible to prevent energy from being lost from the light-emitting layer to the first carrier injection layer. Similarly, the region which is not doped with the organic light-emitting material and the dopant between the light-emitting layer and the second carrier injection layer can prevent energy from being lost from the light-emitting layer to the second carrier injection layer.

The organic electroluminescence element of the present invention is arranged such that the organic light-emitting material is a phosphorescence-emitting material.

With the arrangement, it is possible to obtain an organic EL element which exhibits high light-emitting efficiency and a long life.

The manufacturing method of the present invention may be arranged such that the first host material, the second host material, and the organic light-emitting material meet at least one of equations (16) and (17) below in terms of Highest Occupied Molecular Orbital (HOMO) and Lowest Unoccupied Molecular Orbital (LUMO).

|LUMO of the first host material|>|LUMO of the organic light-emitting material| (16)

|HOMO of the second host material|<|HOMO of the organic light-emitting material| (17)

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

EXAMPLES

The following explains the present invention in more detail by showing Examples. It should be noted that the present invention is not limited to these Examples and may be applied in many variations within the spirit of the present invention.

Example 1

A silicon semiconductor film was formed on a glass substrate by plasma chemical vapor deposition (plasma CVD) and was subjected to a crystalline process to form a polycrystalline semiconductor film. Subsequently, the polycrystalline silicon thin film was etched to form a plurality of island-shaped patterns. Next, a gate insulating film made of silicon nitride (SiN) was formed on each island of the polycrystalline silicon thin film. Thereafter, titanium (Ti), aluminum (Al), and titanium (Ti) were sequentially laminated to form a gate electrode, which was etched to be patterned. A source electrode and a drain electrode each made of Ti—Al—Ti was formed on each gate electrode to form a plurality of thin film transistors.

An interlayer insulating film having through-holes was formed on the thin film transistors thus formed, so that the thin film transistors were planarized. Indium thin oxide (ITO) electrodes were formed as cathodes via the through-holes. A single layer made of polyimide resin was formed to surround the ITO electrodes and the ITO electrodes were patterned, and then the substrate on which the ITO electrodes were formed was subjected to ultrasonic cleaning and was baked at 200° C. under reduced pressure for 3 hours.

Subsequently, 4,4'-bis[N-(1-naphthyl)-N-phenyl-amino] biphenyl (α-NPD) was deposited on the cathodes by vacuum deposition at deposition speed of 1 Å/sec. Thus, an electron hole injection layer of 45 nm in thickness was formed on the cathodes.

Thereafter, N,N-dicarbazoyl-3,5-benzene (mCP) was deposited on the electron hole injection layer by vacuum deposition at deposition speed of 1 Å/sec. Thus, an electron hole transportation layer of 15 nm in thickness was formed on the electron hole injection layer.

Thereafter, 2,8-bis(diphenylphosphoryl)dibenzothiophene (PPT) and iridium(III)bis(4',6'-difluorophenylpyridinato)tetrakis(1-pyrazolyl)borate (FIr6) were codeposited on the electron hole transportation layer by vacuum deposition. At that time, PPT was doped with approximately 7.5% of FIr6. Thus, a first light-emitting layer of 10 nm in thickness was formed on the electron hole transportation layer.

Thereafter, diphenyldi(o-tolyl)silane (UGH1) and FIr6 were codeposited on the first light-emitting layer by vacuum deposition. At that time, UGH1 was doped with approximately 7.5% of FIr6. Thus, a third light-emitting layer of 2 nm in thickness was formed on the first light-emitting layer.

Thereafter, 9-(4-tert-butylphenyl)-3,6-bis(triphenylsilyl)-9H-carbazole (CzSi) and FIr6 were codeposited on the third light-emitting layer by vacuum deposition. At that time, CzSi was doped with approximately 7.5% of FIr6. Thus, a second light-emitting layer of 30 nm in thickness was formed on the third light-emitting layer.

Subsequently, 1,3,5-tris(N-phenylbenzimidazole-2-il) benzene (TPBI) was deposited on the second light-emitting layer by vacuum deposition. Thus, an electron transportation layer of 10 nm in thickness was formed on the second light-emitting layer.

Subsequently, lithium fluoride (LiF) was deposited on the electron transportation layer by vacuum deposition at deposition speed of 1 Å/sec. to form an LiF film of 0.5 nm in thickness. Thereafter, an aluminum (Al) film of 100 nm in thickness was formed on the LiF film. Thus, the laminate film made of LiF and Al was formed as an anode, so that the organic EL element was formed.

The organic EL element thus obtained was measured in terms of current efficiency and life $T_{50}$ at 1000 cd/m$^2$. The result of the measurement shows that the current efficiency was 20 cd/A and the life $T_{50}$ was 3000 h, which are good results.

In the above example, the light-emitting layer has a multilayered structure, and the host materials for the light-emitting layer are selected in consideration of the phosphorescence-emitting material. Specifically, in the present example, the host material for the first light-emitting layer is PPT whose Highest Occupied Molecular Orbital (HOMO) level is higher than HOMO level of FIr6. Furthermore, the host material for the second light-emitting layer is CzSi whose Lowest Unoccupied Molecular Orbital (LUMO) level is lower than LUMO level of FIr6. Furthermore, the host material for the third light-emitting layer is UGH1 whose HOMO level is higher than HOMO level of FIr6 and whose LUMO level is lower than LUMO level of FIr6. Consequently, it is possible to surely transfer electron holes from the cathode to the third light-emitting layer. Similarly, it is possible to surely transfer electrons from the anode to the third light-emitting layer. Furthermore, since the third light-emitting layer is designed to have a large gap between HOMO level and LUMO level, it is possible to confine electron holes and electrons to the third light-emitting layer. Consequently, it is possible to increase a recombination ratio between electron holes and electrons. Thus, the organic EL element of the present example allowed efficient transfer of electron holes and electrons, thereby exhibiting good results both in terms of the current efficiency and the life $T_{50}$.

Example 2

An organic EL element was prepared in such a manner that the host material for the second light-emitting layer was changed from CzSi (HOMO level=6.0 eV, LUMO level=2.5 eV) in Example 1 to adamantane carbazole (Ad-Cz) (HOMO level=5.8 eV, LUMO level=2.6 eV) and the light-emitting material was FIr6 (HOMO level=6.1 eV, LUMO level=3.1 eV) as with Example 1. The organic EL element of Example 2 was prepared in such a manner that the materials for respective layers were the same as those in Example 1 and the thicknesses for respective layers were the same as those of Example 1 except that the host material for the second light-emitting layer was Ad-Cz.

The organic EL element thus obtained was measured in terms of current efficiency and a driving voltage at 1000 cd/m$^2$. The result of the measurement shows that the current efficiency was 15 cd/A and the voltage was approximately 80% of the voltage in Example 1, which are good results. These results show that the organic EL element shows good results both in the case of 0.1 eV in Example 1 and in the case of 0.3 eV in Example 2.

This relates to the fact that electron holes and electrons are transferred in an organic EL element by hopping conduction. Mobility of electron holes decreases by $\exp(-\Delta E/RT)$ where $\Delta E$ represents a gap between a level at which electron holes are trapped and a level at which electron holes hop in hopping conduction (R: gas constant, T: absolute temperature [K]). In consideration of this, it is preferable that the host material for the second light-emitting layer has HOMO level lower than that of the phosphorescence-emitting material.

Here, if the gap between HOMO level of the host material for the second light-emitting layer and HOMO level of the phosphorescence-emitting material is larger than 0.5 eV, the ratio of thermally exciting electron holes decreases. Therefore, it is more preferable that the gap between HOMO level of the host material for the second light-emitting layer and HOMO level of the phosphorescence-emitting material is not more than 0.5 eV. Specifically, moving speed of electrons (electron holes) can be expressed by general Arrenius equation as shown by equation (1) below. $k_{ET}$ indicates a moving speed constant of electrons (electron holes) and A indicates a frequency factor (constant unrelated to temperature).

$$k_{ET} = A\exp(-\Delta E/RT) \qquad (1)$$

As described in Non-patent Literature 3, A is $10^{11}M^{-1}s^{-1}$ in the case of intermolecular reaction. Here, the speed constant calculated from equation (1) depending on the value of $\Delta E$ is shown below.

In case of $\Delta E$=0.1 eV, $k_{ET}$=2.0×10$^9$ s$^{-1}$
In case of $\Delta E$=0.2 eV, $k_{ET}$=4.1×10$^7$ s$^{-1}$
In case of $\Delta E$=0.3 eV, $k_{ET}$=8.4×10$^5$ s$^{-1}$
In case of $\Delta E$=0.4 eV, $k_{ET}$=1.7×10$^4$ s$^{-1}$
In case of $\Delta E$=0.5 eV, $k_{ET}$=3.5×10$^2$ s$^{-1}$
In case of $\Delta E$=0.6 eV, $k_{ET}$=7.1 s$^{-1}$ The above results show that when $\Delta E$ is not more than 0.5 eV, electron transfer occurs between molecules from the host material for the first light-emitting layer to the phosphorescence-emitting material within sub ms (29 ms in case of 0.5 eV), whereas when $\Delta E$ is 0.6 eV or more, electron transfer occurs only per sec. That is, electron transfer can occur even in the case of uphill energy difference if the difference is not more than 0.5 eV.

Furthermore, energy [f(x)] which is stabilized by an electric field can be expressed by equation (2) below. Specifically, [f(x)] indicates energy with which electrons at a distance of x are stabilized when an electric field of V is applied. q indicates elementary charge (absolute value of electric charge).

$$f(x)=-qVx \quad (2)$$

That is, as is seen from equation (2), application of an electric field makes electron transfer (electron hole transfer) in a backward direction less likely to occur, and electron transfer (electron hole transfer) is likely to occur along a gradient of the electric field. That is, once electron holes are transferred as a result of the influence of an electric field, the electron holes are less likely to move back from the first light-emitting layer to the material at the cathode side such as the electron hole transportation material, and electron hole transfer from the host material for the first light-emitting layer to the phosphorescence-emitting material is dominant.

Therefore, by setting the gap between HOMO level of the host material for the second light-emitting layer and HOMO level of the phosphorescence-emitting material to be not more than 0.5 eV, a ratio of thermally exciting electron holes can be increased, so that a recombination ratio between electron holes and electrons can be increased. In consideration of the result of Example 2, it is more preferable that the gap between HOMO level of the host material for the second light-emitting layer and HOMO level of the phosphorescence-emitting material is not more than 0.3 eV.

Furthermore, it is preferable that the gap between the HOMO level of the host material for the second light-emitting layer and HOMO level of the phosphorescence-emitting material is more than 0 eV. It is more preferable that the gap is 0.1 eV or more because such a value allows reduction of a voltage required for driving the device.

Furthermore, for the same reason as above, it is preferable that the gap between LUMO level of the host material for the first light-emitting layer and LUMO level of the phosphorescence-emitting material is more than 0 eV and not more than 0.5 eV. It is more preferable that the gap is not less than 0.1 eV and not more than 0.3 eV.

Comparative Example 1

There was prepared an organic EL element including a single light-emitting layer, which was changed from the organic EL element of Example 1 in that the first light-emitting layer and the second light-emitting layer were omitted and UGH1 being a wide gap host was used as the material for the single light-emitting layer. The organic EL element of Comparative Example 1 was prepared in such a manner that the layers up to an electron hole transportation layer were formed similarly with Example 1 and thereafter UGH1 and FIr6 were codeposited on the electron hole transportation layer by vacuum deposition. Here, UGH1 was doped with approximately 7.5% of FIr6. Thus, a light-emitting layer (single layer) of 30 nm in thickness was formed.

Subsequently, an electron transportation layer, LiF, and Al were formed on the light-emitting layer similarly with Example 1, and thus the organic EL element was prepared.

The organic EL element thus obtained was measured in terms of current efficiency at 1000 cd/m$^2$. The result of the measurement shows that the current efficiency was 10 cd/A, which is a half of the current efficiency in Example 1.

Comparative Example 2

There was prepared an organic EL element whose second light-emitting layer was designed such that the light-emitting material is FIr6 as with Example 1 but the host material was changed from CzSi in Example 1 to UGH1. The organic EL element of Comparative Example 2 was prepared in such a manner that the materials for respective layers were the same as those in Example 1 and the thicknesses for respective layers were the same as those of Example 1 except that the host material for the second light-emitting layer was UGH1.

The organic EL element thus obtained was measured in terms of current efficiency and a driving voltage at 1000 cd/m$^2$. The result of the measurement shows that the current efficiency was 10 cd/A, which was a half of Example 1. Furthermore, the driving voltage was approximately two times larger than that of Example 1.

Industrial Applicability

The present invention is applicable to various devices including an organic EL element. For example, the present invention is applicable to display devices etc. such as television receivers.

REFERENCE SIGNS LIST 1, 31 Organic EL element
2, 32 Cathode
3, 33 Electron hole injection layer
4, 34 Electron hole transportation layer
5, 35 Light-emitting layer
5a First light-emitting layer
5b Third light-emitting layer
5c Second light-emitting layer
6, 36 Electron transportation layer
7, 37 Electron injection layer
8, 38 Highest Occupied Molecular Orbital of phosphorescence-emitting material
9, 39 Lowest Unoccupied Molecular Orbital of phosphorescence-emitting material

The invention claimed is:
1. An organic electroluminescence element, comprising: on a substrate, a cathode and an anode; and an organic layer between the cathode and the anode, the organic layer including at least a light-emitting layer,
the light-emitting layer including:
a first light-emitting layer which is positioned closer to the cathode and which is made of a first host material;
a second light-emitting layer which is positioned closer to the anode and which is made of a second host material; and a third light-emitting layer which is positioned between the first light-emitting layer and the second light-emitting layer and which is made of a third host material, the first host material, the second host material, and the third host material being different from one another, and the first host material, the second host material, and the third host material being doped with a same organic light-emitting material, and the first host material, the second host material, the third host material, and the organic light-emitting material meeting equations (1) and (2) below in terms of Highest Occupied Molecular Orbital (HOMO) and Lowest Unoccupied Molecular Orbital (LUMO):

$$|\text{HOMO of the first host material}| > |\text{HOMO of the organic light-emitting material}| \text{ and } |\text{HOMO of the organic light-emitting material}| < |\text{HOMO of the third host material}| \quad (1)$$

$$|\text{LUMO of the second host material}| < |\text{LUMO of the organic light-emitting material}| \text{ and } |\text{LUMO of the organic light-emitting material}| > |\text{LUMO of the third host material}| \quad (2).$$

2. The organic electroluminescence element as set forth in claim 1, wherein the first host material, the second host material, and the organic light-emitting material meet equations (3) and (4) below in terms of Highest Occupied Molecular Orbital (HOMO) and Lowest Unoccupied Molecular Orbital (LUMO):

$$|\text{LUMO of the first host material}| > |\text{LUMO of the organic light-emitting material}| \quad (3)$$

$$|\text{HOMO of the second host material}| < |\text{HOMO of the organic light-emitting material}| \quad (4).$$

3. The organic electroluminescence element as set forth in claim 1, wherein the first host material, the second host material, and the third host material each have an excited triplet level higher than an excited triplet level of the organic light-emitting material.

4. The organic electroluminescence element as set forth in claim 1, wherein the first host material, the second host material, and the third host material meet equations (5) and (6) below in terms of electron hole mobility and electron mobility:

$$\text{Electron hole mobility of the first host material} > \text{electron hole mobility of the third host material} \quad (5)$$

$$\text{Electron mobility of the second host material} > \text{electron mobility of the third host material} \quad (6).$$

5. The organic electroluminescence element as set forth in claim 1, wherein the first host material, the second host material, and the third host material meet equations (7) and (8) below in terms of thickness:

$$\text{Thickness of the first light-emitting layer} > \text{thickness of the third light-emitting layer, and thickness of the third light-emitting layer} < \text{thickness of the second light-emitting layer} \quad (7)$$

$$5 \text{ Å} < \text{thickness of the third light-emitting layer} < 42 \text{ Å} \quad (8).$$

6. The organic electroluminescence element as set forth in claim 1, wherein the third light-emitting layer meets equation (9) below in terms of thickness:

$$10 \text{ Å} < \text{thickness of the third light-emitting layer} < 30 \text{ Å} \quad (9).$$

7. The organic electroluminescence element as set forth in claim 1, wherein the first host material, the second host material, and the organic light-emitting material meet at least one of equations (10) and (11) below in terms of Highest Occupied Molecular Orbital (HOMO) and Lowest Unoccupied Molecular Orbital (LUMO):

$$0 \text{ eV} < (|\text{LUMO of the first host material}| - |\text{LUMO of the organic light-emitting material}|) \leq 0.5 \text{ eV} \quad (10)$$

$$0 \text{ eV} < (|\text{HOMO of the organic light-emitting material}| - |\text{HOMO of the second host material}|) \leq 0.5 \text{ eV} \quad (11).$$

8. The organic electroluminescence element as set forth in claim 1, wherein the first host material, the second host material, and the organic light-emitting material meet at least one of equations (12) and (13) below in terms of Highest Occupied Molecular Orbital (HOMO) and Lowest Unoccupied Molecular Orbital (LUMO):

$$0.1 \text{ eV} \leq (|\text{LUMO of the first host material}| - |\text{LUMO of the organic light-emitting material}|) \leq 0.3 \text{ eV} \quad (12)$$

$$0.1 \text{ eV} (|\text{HOMO of the organic light-emitting material}| - |\text{HOMO of the second host material}|) \leq 0.3 \text{ eV} \quad (13).$$

9. The organic electroluminescence element as set forth in claim 1, wherein the organic layer includes an electron hole injection layer doped with a dopant for facilitating injection of electron holes from the cathode to the organic layer, and an electron injection layer doped with a dopant for facilitating injection of electrons from the anode to the organic layer.

10. The organic electroluminescence element as set forth in claim 9, wherein between the electron hole injection layer and the light-emitting layer, there is provided a region which is not doped with the dopant and the organic light-emitting material.

11. The organic electroluminescence element as set forth in claim 10, wherein between the electron injection layer and the light-emitting layer, there is provided a region which is not doped with the dopant and the organic light-emitting material.

12. The organic electroluminescence element as set forth in claim 1, wherein the organic light-emitting material is a phosphorescence-emitting material.

13. An organic electroluminescence display device, comprising display means in which an organic electroluminescence element as set forth in claim 1 is formed on a thin film transistor substrate.

14. A manufacturing method of an organic electroluminescence element including: on a substrate, a cathode and an anode; and an organic layer between the cathode and the anode, the organic layer including at least a light-emitting layer, the manufacturing method comprising:

a cathode formation step of forming the cathode on the substrate;

an electron hole injection layer formation step of forming, on the cathode, an electron hole injection layer to which electron holes are injected from the cathode;

an electron hole transportation layer formation step of forming, on the electron hole injection layer, an electron hole transportation layer via which electron holes injected from the cathode to the organic layer are transported;

a first light-emitting layer formation step of forming, on the electron hole transportation layer, a first light-emitting layer as the light-emitting layer, the first light-emitting layer being made of a first host material;

a third light-emitting layer formation step of forming, on the first light-emitting layer, a third light-emitting layer as the light-emitting layer, the third light-emitting layer being made of a third host material;

a second light-emitting layer formation step of forming, on the third light-emitting layer, a second light-emitting layer as the light-emitting layer, the second light-emitting layer being made of a second host material;

an electron transportation layer formation step of forming, on the second light-emitting layer, an electron transportation layer via which electrons injected from the anode to the organic layer are transported;

an electron injection layer formation step of forming, on the electron transportation layer, an electron injection layer to which electrons are injected from the anode; and an anode formation step of forming the anode on the electron injection layer, in the first light-emitting layer formation step, the second light-emitting layer formation step, and the third light-emitting layer formation step, the first host material, the second host material, and the third host material being different from one another, the first host material, the second host material, and the third host material being doped with a same organic light-emitting material, and the first host material, the second host material, the third host material, and the organic light-emitting material meeting equations (14) and (15) below in terms of Highest Occupied Molecular Orbital (HOMO) and Lowest Unoccupied Molecular Orbital (LUMO):

$$|\text{HOMO of the first host material}| > |\text{HOMO of the organic light-emitting material}| \text{ and } |\text{HOMO of the organic light-emitting material}| < |\text{HOMO of the third host material}| \tag{14}$$

$$|\text{LUMO of the second host material}| < |\text{LUMO of the organic light-emitting material}| \text{ and } |\text{LUMO of the organic light-emitting material}| > |\text{LUMO of the third host material}| \tag{15}$$

15. The manufacturing method as set forth in claim 14, wherein the first host material, the second host material, and the organic light-emitting material meet at least one of equations (16) and (17) below in terms of Highest Occupied Molecular Orbital (HOMO) and Lowest Unoccupied Molecular Orbital (LUMO):

$$|\text{LUMO of the first host material}| > |\text{LUMO of the organic light-emitting material}| \tag{16}$$

$$|\text{HOMO of the second host material}| < |\text{HOMO of the organic light-emitting material}| \tag{17}$$

\* \* \* \* \*